US012690186B2

(12) United States Patent
Sung et al.

(10) Patent No.: US 12,690,186 B2
(45) Date of Patent: Jul. 21, 2026

(54) STRUCTURE WITH FRONTSIDE AND BACKSIDE DRAMS

(71) Applicant: International Business Machines Corporation, Armonk, NY (US)

(72) Inventors: Min Gyu Sung, Latham, NY (US); Kangguo Cheng, Schenectady, NY (US); Ruilong Xie, Niskayuna, NY (US); Chanro Park, Clifton Park, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 309 days.

(21) Appl. No.: 18/060,821

(22) Filed: Dec. 1, 2022

(65) Prior Publication Data

US 2024/0188282 A1     Jun. 6, 2024

(51) Int. Cl.
H10B 12/00          (2023.01)
H10W 20/20          (2026.01)

(52) U.S. Cl.
CPC ........... H10B 12/37 (2023.02); H10B 12/315 (2023.02); H10W 20/20 (2026.01)

(58) Field of Classification Search
CPC ...... H10B 12/37; H10B 12/315; H10B 12/09; H10W 20/20
See application file for complete search history.

(56) References Cited

U.S. PATENT DOCUMENTS

| | | | |
|---|---|---|---|
| 6,396,121 B1 | 5/2002 | Bertin et al. | |
| 6,774,424 B2 | 8/2004 | Lee | |
| 8,557,632 B1 | 10/2013 | Or-Bach et al. | |
| 9,368,501 B2 | 6/2016 | Yamazaki et al. | |
| 10,297,586 B2 | 5/2019 | Or-Bach et al. | |
| 12,120,865 B2 * | 10/2024 | Huang ................... | H10B 12/30 |
| 2017/0207214 A1 | 7/2017 | Or-Bach et al. | |
| 2020/0411524 A1 | 12/2020 | Arslan et al. | |
| 2022/0199624 A1 | 6/2022 | Huang et al. | |
| 2023/0402367 A1 * | 12/2023 | Wu ........................ | H10W 20/42 |
| 2025/0359005 A1 * | 11/2025 | Wang ..................... | H10D 89/10 |

FOREIGN PATENT DOCUMENTS

| | | |
|---|---|---|
| CN | 113903735 A | 1/2022 |
| KR | 120040009383 A | 1/2004 |

OTHER PUBLICATIONS

James, D., "Recent Innovations in DRAM Manufacturing", Advanced Semiconductor Manufacturing Conference (ASMC), 2010 IEEE/SEMI, Aug. 2010, 6 pages.
Hijioka, K., et al., "A Novel Cylinder-Type MIM Capacitor in Porous Low-k Film (CAPL) for Embedded DRAM with Advanced CMOS Logics", 2010 International Electron Devices Meeting, Date of Conference: Dec. 6-8, 2010, 4 pages.

* cited by examiner

*Primary Examiner* — Richard A Booth

(74) *Attorney, Agent, or Firm* — Scully, Scott, Murphy & Presser, P.C.; Samuel Waldbaum

(57)          ABSTRACT

A semiconductor structure having a high cell density is provided in which a frontside dynamic access memory (DRAM) is located on a frontside of a semiconductor substrate, and a backside DRAM is located on a backside of the semiconductor substrate. Peripheral transistors can be located on the frontside of the semiconductor substrate and at a same level as frontside transistors of the frontside DRAM.

20 Claims, 9 Drawing Sheets

STRUCTURE WITH FRONTSIDE AND BACKSIDE DRAMS

BACKGROUND

The present application relates to semiconductor technology, and more particularly to a semiconductor structure including a frontside dynamic access memory (DRAM) located on a frontside of a semiconductor substrate, and a backside DRAM located on a backside of the semiconductor substrate.

DRAM is a type of random access memory that stores each bit of data in a memory cell, usually including a capacitor and a transistor, both typically based on metal oxide semiconductor (MOS) technology. The capacitor of the DRAM can either be charged or discharged; these two states are taken to represent the two values of a bit, conventionally called 0 and 1. As the design rules shrink, the capacitor in a DRAM has become narrower and longer. Thus, the capacitors in present DRAMS have a high aspect ratio that can lead to mechanical instability.

SUMMARY

A semiconductor structure having a high cell density is provided in which a frontside DRAM is located on a frontside of a semiconductor substrate, and a backside DRAM is located on a backside of the semiconductor substrate. Peripheral transistors can be located on the frontside of the semiconductor substrate and at a same device level as frontside transistors of the frontside DRAM.

In one aspect of the present application, a semiconductor structure is provided. In one embodiment, the semiconductor structure includes a semiconductor substrate having a frontside and a backside. A frontside DRAM including a plurality of frontside transistors and a plurality of frontside capacitors is located on the frontside of the semiconductor substrate, and a backside DRAM including a plurality of backside transistors and a plurality of backside capacitors is located on the backside of the semiconductor substrate. A plurality of peripheral transistors are located on the frontside of the semiconductor substrate and at a same device level as the plurality of frontside transistors. The plurality of peripheral transistors are electrically connected to both the frontside DRAM and the backside DRAM.

DETAILED DESCRIPTION

Figure 1:
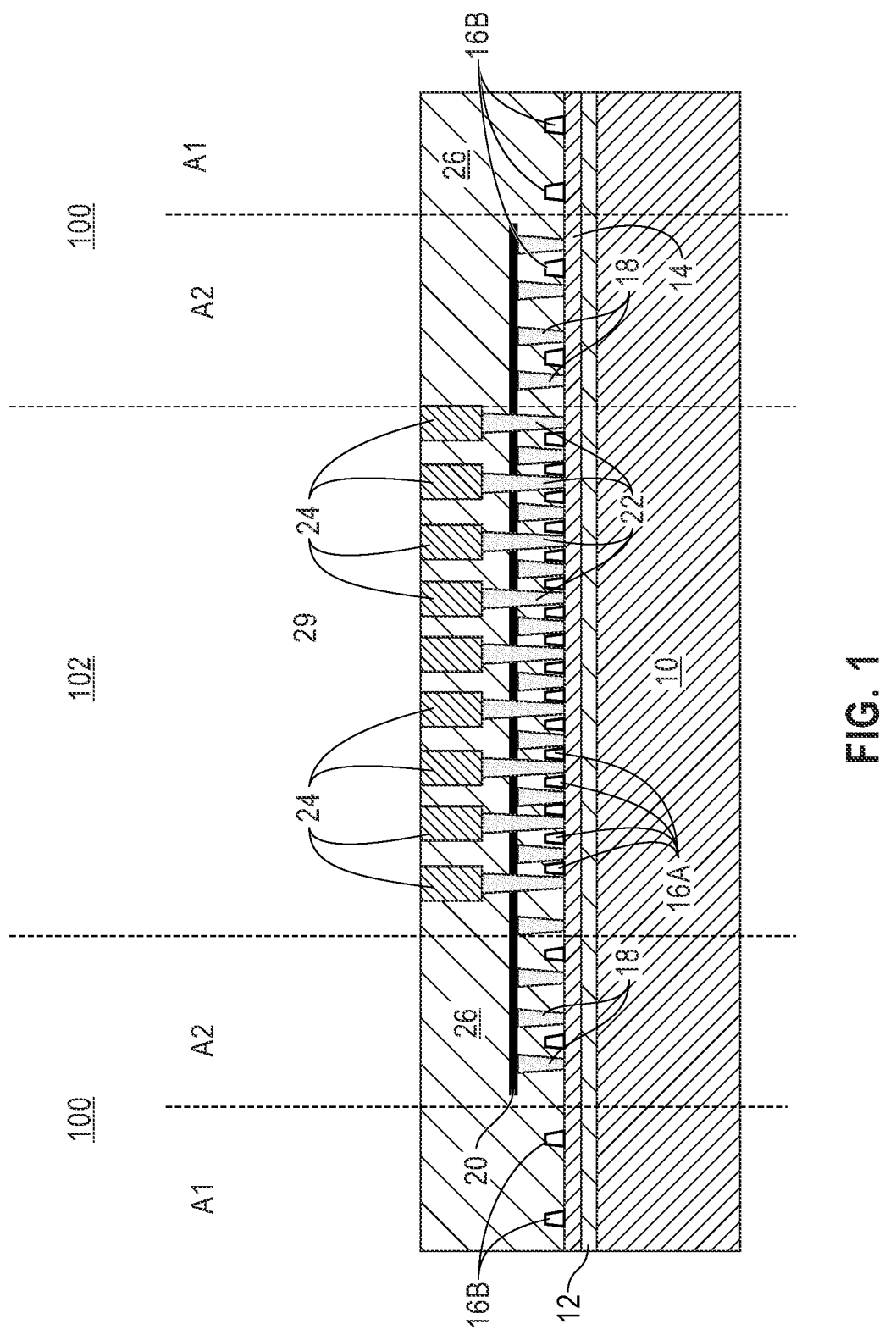
FIG. 1 is a cross sectional view of an exemplary structure that can be employed in accordance with an embodiment of the present application, the exemplary structure including a frontside DRAM including a plurality of frontside transistors and a plurality of frontside capacitors formed on a frontside of a semiconductor substrate, a plurality of peripheral transistors located adjacent to the frontside DRAM and at a same device level as the plurality of frontside transistors, and a frontside bitline located between the plurality of frontside transistors and the plurality of frontside capacitors.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In the present application, chemical elements can be referred to using their chemical symbol from the Periodic Table of Elements. For example, aluminum can be referred to as "Al", tungsten can be referred to as "W", copper can be referred to as "Cu", etc.

Referring first to FIG. 1, there is illustrated an exemplary structure that can be employed in accordance with an embodiment of the present application. The exemplary structure includes a frontside DRAM including a plurality of frontside transistors 16A and a plurality of frontside capacitors 24 formed on a frontside of a semiconductor substrate, a plurality of peripheral transistors 16B located adjacent to the frontside DRAM and at a same device level as the plurality of frontside transistors 16A, and a frontside bitline 20 located between the plurality of frontside transistors 16A and the plurality of frontside capacitors 24. The frontside DRAM is located in a DRAM device region 102, while the plurality of peripheral transistors 16B are located in a peripheral transistor device region 100. In the drawings, two peripheral transistor device regions 100 are shown on both sides of the DRAM device region 100. Each peripheral transistor device region 100 can be broken up to include a first peripheral transistor sub-region A1 and a second peripheral transistor sub-region A2. The first sub-region A1 includes a first set of the plurality of peripheral transistors 16B that provide logic devices for the backside DRAM (to be subsequently formed on a backside of the semiconductor substrate). The second sub-region A2 includes a second set of the peripheral transistors 16B that provide logic devices for the frontside DRAM.

The semiconductor substrate includes backside semiconductor device layer 10, dielectric material layer 12, and frontside semiconductor device layer 14. In the present application, the term "frontside" denotes a side of the semiconductor substrate in which the frontside DRAM and the plurality of peripheral of transistors 16B are found, while the term "backside" denotes a side of the semiconductor substrate in which the backside DRAM will be subsequent formed. The backside of the semiconductor substrate can include the backside semiconductor device layer 10. In the present application, the plurality of frontside transistor 16A and the plurality of peripheral of transistors 16B are formed on the frontside semiconductor device layer 14. In the present application, the frontside is isolated from the backside by dielectric material layer 12.

The backside semiconductor device layer 10 is composed of a first semiconductor material having semiconducting properties. Examples of first semiconductor materials that can be used to provide the backside semiconductor device layer 10 include, but are not limited to, silicon (Si), a silicon germanium (SiGe) alloy, a silicon germanium carbide (SiGeC) alloy, germanium (Ge), III/V compound semiconductors or II/VI compound semiconductors. The frontside semiconductor device layer 14 of the semiconductor substrate is composed of a second semiconductor material. The second semiconductor material that provides the frontside semiconductor device layer 14 can be compositionally the same as, or compositionally different from, the first semiconductor material that provides the backside semiconductor device layer 10. The dielectric material layer 12 of the semiconductor substrate can include, for example, silicon dioxide and/or boron nitride. In one example, the backside semiconductor device layer 10 is composed of silicon, the dielectric material layer 12 is composed of silicon dioxide, and the frontside semiconductor device layer 14 is composed of silicon. The semiconductor substrate of the present application can be referred to as a semiconductor-on-insulator (SOI) substrate.

The plurality of frontside transistors 16A and the plurality of peripheral of transistors 16B are field effect transistors (FETs; FETs are three terminal devices) including a gate structure and a source/drain region located on each side of the gate structure. The gate structure includes a gate dielectric material and a gate electrode, both of which are not separately shown in the drawings of the present application. As is known to those skilled in the art, the gate dielectric material directly contacts a physically exposed surface(s) of a semiconductor channel material, and the gate electrode is formed on the gate dielectric material. The plurality of frontside transistors 16A and the plurality of peripheral transistors 16B can include planar FET devices, finFET devices, nanowire FET devices, nanosheet FET devices or any combination of these types of FET devices. In the drawings of the present application, all the various transistors are all depicted as planar FET devices in which the semiconductor channel material is part of the semiconductor substrate.

The gate dielectric material of the gate structure typically has a dielectric constant of 4.0 or greater. All dielectric constants mentioned herein are measured in a vacuum unless otherwise indicated. Illustrative examples of gate dielectric materials include, but are not limited to, silicon dioxide, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb(Sc,Ta)($O_3$), and/or lead zinc niobite (Pb(Zn,Nb)O). The gate dielectric material can further include dopants such as La, Al and/or Mg.

The gate electrode of the gate structure can include a conductive metal, a work function metal (WFM), or a combination of a conductive metal and a WFM. The conductive metal that can be used as the gate electrode includes, but is not limited to, Al, W. or Co. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the WFM-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

Frontside bitline 20 is present in the DRAM device region 100 and it can extend into the second sub-region A2, as is illustrated in FIG. 1; the frontside bitline 20 need not extend into the first sub-region A1. The frontside bitline 20 is composed of any electrically conductive metal-containing material including, but not limited to, W, Co, Ru, Al, Cu, Pt, Rh, or Pd, with a thin metal adhesion layer (such as TiN, TaN) typically being formed prior to the conductive metal deposition; for clarity, the metal adhesion layer is not separately illustrated in the drawings of the present application.

Each frontside capacitor 24 is a stacked capacitor including a bottom conductive plate and a top conductive plate that are spaced apart from each other by a capacitor dielectric material; thus the capacitor dielectric material is sandwiched between the bottom and top conductive plates. Such a stacked arrangement improves the density of the frontside DRAM. The two conductive plates of the stacked capacitor can be composed of any capacitor electrode material such as, for example, Cu, Ta, W, Al, Ru, Rh, Co, Mo, TiN or TiN. The two conductive plates can be composed of a compositionally same, or compositionally different, capacitor electrode material. The capacitor dielectric material that is located between the two conductive plates can include any capacitor dielectric material including one of the gate dielectric materials mentioned above for the gate structure.

The frontside bitline 20 is electrically connected to one source/drain region of each of the frontside transistors 16A by a frontside bitline-to-transistor contact structure 18, and each of the frontside capacitors 24 is electrically connected to another source/drain region of each of the frontside transistors 16A by a frontside capacitor-to-transistor contact structure 22. As is illustrated in FIG. 1, each frontside capacitor-to-transistor contact structure 22 passes through the transistor channel and connects to the frontside bitline 20. In the present application, the second set of peripheral transistors 16B that are present in sub-region A2 can also be electrically connected to the frontside bitline 20 by one of the bitline-to-transistor contact structures 18.

The frontside bitline-to-transistor contact structures 18 and the frontside capacitor-to-transistor contact structures 22 include at least a contact conductor material such as, for example, W, Cu, Al, Co, Ru, Mo, Os, Ir, Rh or an alloy thereof. In embodiments, the frontside bitline-to-transistor contact structures 18 and the frontside capacitor-to-transistor contact structures 22 can also include a silicide liner such as TiSi, NiSi, NiPtSi, etc., and an adhesion metal liner, such as TiN. In some embodiments, a metal semiconductor alloy region can be formed on the source/drain regions prior to the formation of the frontside bitline-to-transistor contact structures 18 and/or the frontside capacitor-to-transistor contact structures 22. The metal semiconductor alloy region can be composed of a silicide or germicide, and a metal such as, for example Ni, Co, Pt, W, Ti, Ta, a rare earth metal (e.g., Er, Yt, La), an alloy thereof, or any combination thereof.

The frontside bitline-to-transistor contact structures 18 and the frontside capacitor-to-transistor contact structures 22 can further include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC.

A frontside interlayer dielectric material structure 26 embeds the plurality of frontside transistors 16A, the plurality of peripheral transistors 16B, the frontside bitline-to-transistor contact structures 18, the frontside capacitor-to-transistor contact structures 22, and the frontside capacitors 24. The frontside capacitors 24 can have a topmost surface that is coplanar with a topmost surface of the frontside interlayer dielectric material structure 26. The frontside interlayer dielectric material structure 26 includes multiple interlayer dielectric material layers which are formed one upon the other utilizing any suitable deposition process such as, for example, chemical vapor deposition (CVD), plasma enhanced chemical vapor deposition (PECVD) or spin-on coating. A planarization process such, as for example, chemical mechanical polishing (CMP) can follow any of the deposition processes used to provide the frontside interlayer dielectric material structure 26. The frontside interlayer dielectric material structure 26 is composed of at least one dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0.

The exemplary structure shown in FIG. 1 can be formed utilizing conventional front-end-line (FEOL) device processing and conventional middle-of-the-line (MOL) device processing, each of which is well known to those skilled in the art. The FEOL device processing, and MOL device processing can include, for example, various deposition steps, patterning steps and/or metallization steps.

Figure 2:
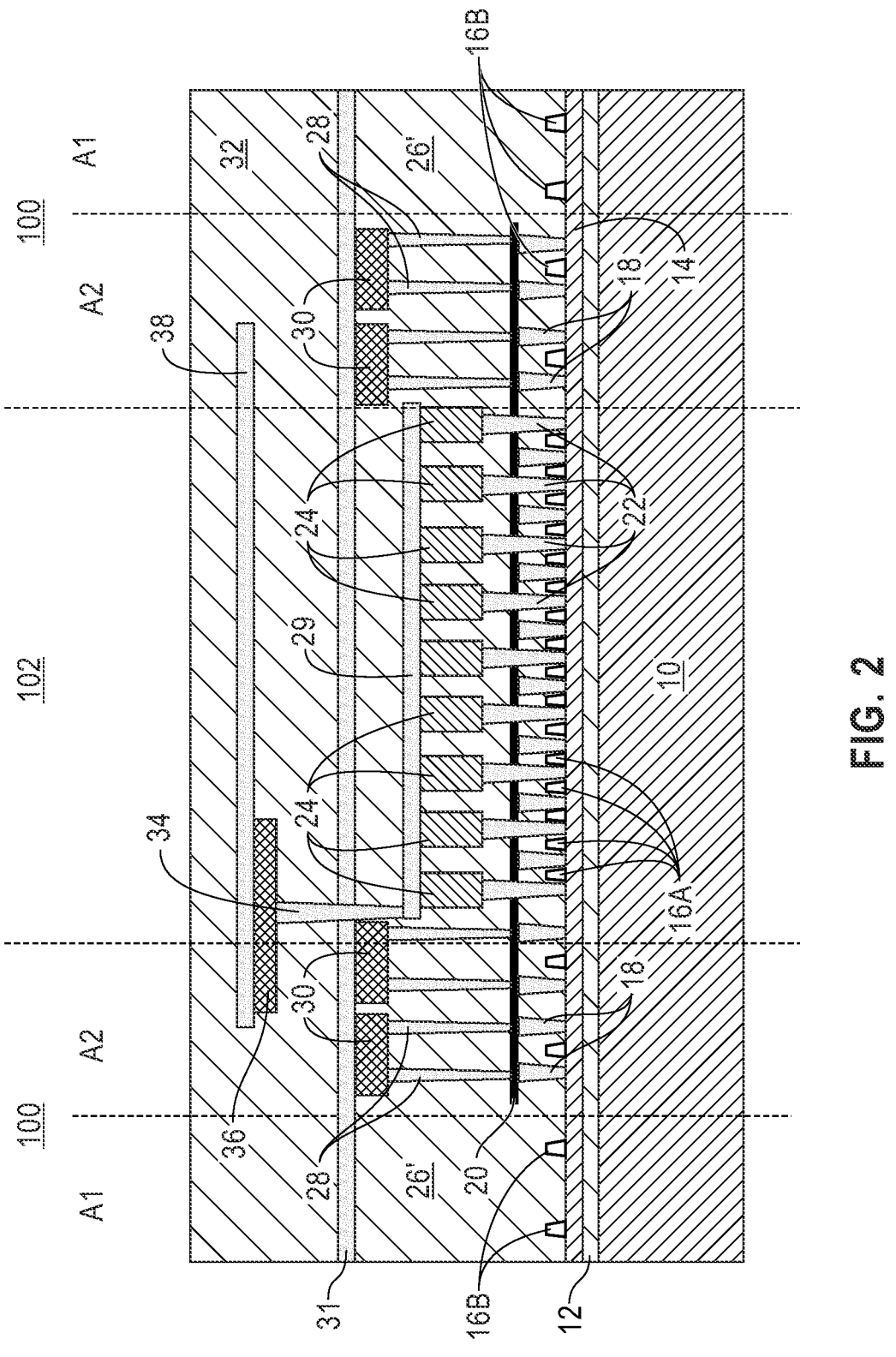
FIG. 2 is a cross sectional view of the exemplary structure shown in FIG. 1 after forming a frontside back-end-of-the-line (BEOL) structure, the frontside BEOL structure including frontside metal lines, frontside metal vias, and frontside line-to-via contact structures.

Referring now to FIG. 2, there is illustrated the exemplary structure shown in FIG. 1 after forming a frontside BEOL structure, the frontside BEOL structure including frontside metal lines 29, 31, 38, frontside metal vias 28, 34, and frontside contact structures 30, 36. Frontside contact structures 30, 36 are used to electrically connect the metal lines to the metal vias, and thus can be referred to as metal line-to-metal via contact structures.

The frontside BEOL structure also includes additional interlayer dielectric material layers that embed the frontside metal lines 29, 31, 38, frontside metal vias 28, 34, and frontside contact structures 30, 36. For example, a first additional interlayer dielectric material layer is formed on the frontside interlayer dielectric material structure 26 to provide a modified frontside interlayer dielectric material structure 26' that embeds frontside metal line 29, frontside metal via 28, frontside contact structure 30, a lower portion of frontside metal via 34, and frontside metal line 31 (not evident from the cross sectional view). A second additional interlayer dielectric material layer 32 is present that embeds frontside metal line 38, an upper portion of frontside metal via 34 and frontside contact structures 36. The first additional interlayer dielectric material layer and the second additional interlayer dielectric material layer 32 include one of the dielectric materials mentioned above for the frontside interlayer dielectric material structure 26. The first additional interlayer dielectric material layer and the second additional interlayer dielectric material layer can be formed utilizing one of the deposition processes mentioned above in forming the various interlayer dielectric material layers that provide the frontside interlayer dielectric material structure 26.

The frontside metal lines 29, 31, 38, frontside metal vias 28, 34, and frontside contact structures 30, 36 can be composed of one of the contact conductor materials mentioned above. The frontside metal lines 29, 31, 38, frontside metal vias 28, 34, and frontside contact structures 30, 36 can also include a silicide liner, an adhesion metal liner, and/or a diffusion barrier material, as mentioned above for the frontside bitline-to-transistor contact structures 18 and the frontside capacitor-to-transistor contact structures 22. The frontside metal lines 29, 31, 38, frontside metal vias 28, 34, and frontside contact structures 30, 36 can be formed utilizing a metallization process.

In the present application, frontside metal line 29 is formed in the DRAM device region 100 and on top of each of the frontside capacitors 24 of the frontside DRAM. Frontside metal line 29 is electrically connected to frontside metal line 31 by frontside metal via 34, and frontside metal via 34 and frontside contact structure 36 are used to electrically connect frontside metal line 29 to frontside metal line 38. Frontside metal line 31 is electrically connected to the frontside bitline 20 in sub-region A2 by frontside metal via 28 and frontside contact structure 30. As is illustrated, the metal vias 28 pass through the frontside bitline 20 and contact the frontside bitline-to-transistor contact structure 18.

Figure 3:
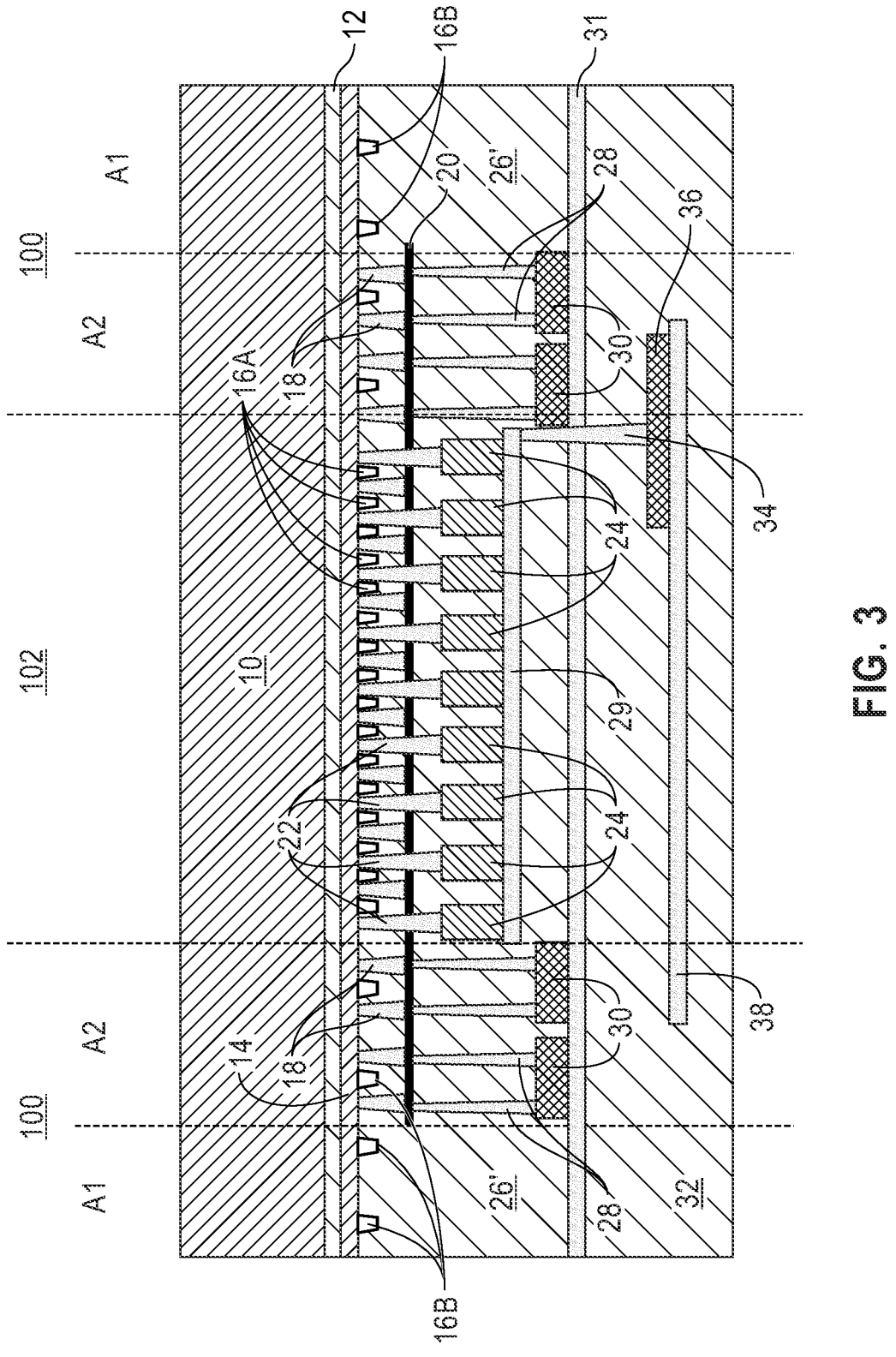
FIG. 3 is a cross sectional view of the exemplary structure shown in FIG. 2 after flipping the structure 180° to physically expose the backside of the semiconductor substrate and to allow backside processing of the exemplary structure.

Referring now to FIG. 3, there is illustrated the exemplary structure shown in FIG. 2 after flipping the structure 180° to physically expose the backside of the semiconductor substrate and to allow backside processing of the exemplary structure. That is, this flipping step physically exposes the backside semiconductor device layer 10. Prior to wafer flipping, a carrier wafer (not shown) can be formed on the frontside BEOL structure by a bonding process. The carrier wafer can include one of the semiconductor materials mentioned above for the backside semiconductor device layer 10. Flipping of the structure can be performed by hand or by utilizing a mechanical means such as, for example, a robot arm.

Figure 4:
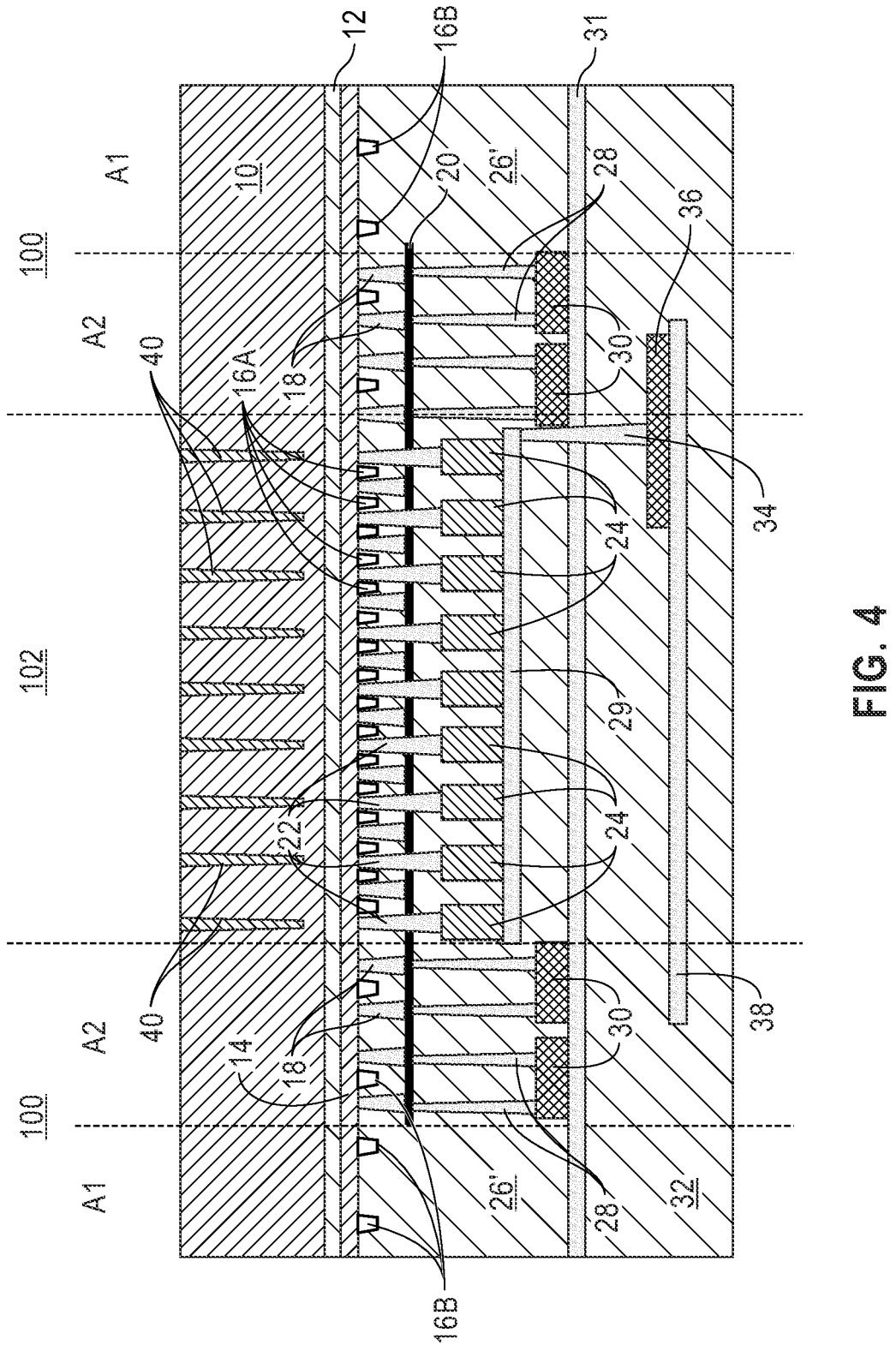
FIG. 4 is a cross sectional view of the exemplary structure shown in FIG. 3 after forming a plurality of backside capacitors in a backside semiconductor device layer of the semiconductor substrate, wherein each backside capacitor is a trench capacitor.

Referring now to FIG. 4, there is illustrated the exemplary structure shown in FIG. 3 after forming a plurality of backside capacitors 40 in backside semiconductor device layer 10 of the semiconductor substrate, wherein each backside capacitor 40 is a trench capacitor. A trench capacitor is a capacitor that is formed inside a trench that is formed in another material layer. Here, the trenches that house the trench capacitor are formed into the backside semiconductor device layer 10 by lithography and etching. In some embodiments, dopants can be introduced into the sidewalls and bottom wall of each of the trenches by ion implantation and form a buried (or first) plate of the trench capacitor. The buried plate is composed of a doped portion of the semiconductor material that is located adjacent to each of the trenches. A capacitor dielectric material and a capacitor electrode material, both as mentioned above, can be formed into each trench, and then a planarization process can be used to remove any capacitor dielectric material and any capacitor electrode material that is formed outside the trench. Alternatively, the trench capacitor can be formed by filling each trench with a frontside capacitor electrode material, a capacitor dielectric material, and then a backside capacitor electrode material followed by a planarization process. Each backside capacitor 40 of the plurality of backside capacitors 40 has a topmost that is coplanar with the topmost surface of the backside semiconductor device layer 10. It is noted that each of the backside capacitors 40 are partially embedded in the backside semiconductor device layer 10.

Figure 5:
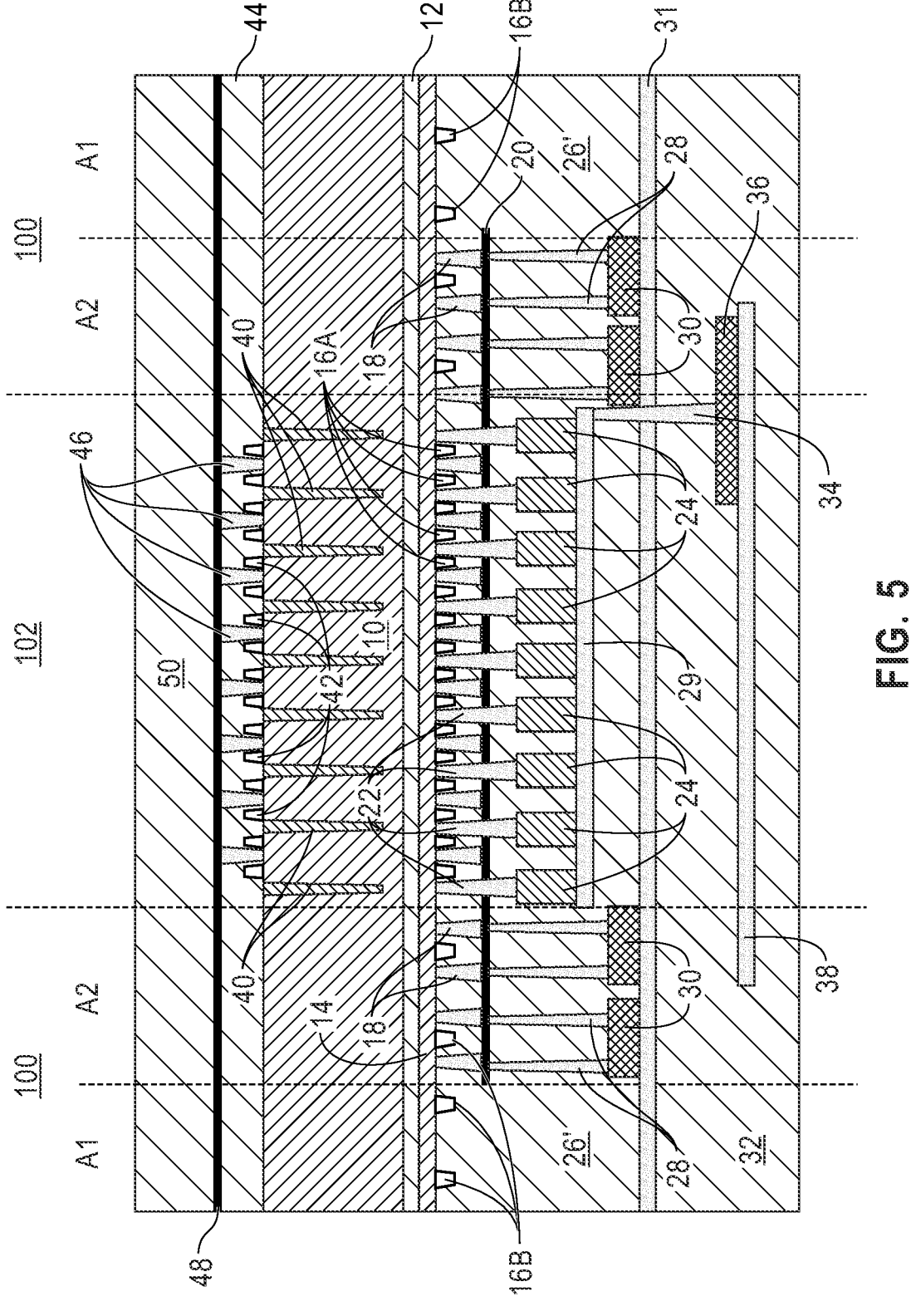
FIG. 5 is a cross sectional view of the exemplary structure shown in FIG. 4 after forming a plurality of backside transistors on the backside semiconductor device layer and forming a backside bitline above the plurality of backside transistors.

Referring now to FIG. 5, there is illustrated the exemplary structure shown in FIG. 4 after forming a plurality of backside transistors 42 on the backside semiconductor device layer 10 and forming a backside bitline 48 above the plurality of backside transistors 42. Also, formed are first backside interlayer dielectric material layer 44, backside bitline-to-transistor contact structures 46, and second backside interlayer dielectric material layer 50. Each backside bitline-to-transistor contact structures 46 electrically connects the backside bitline 48 to a source/drain region of one of the backside transistors 42; in this embodiment each backside capacitor 40 is in direct contact with another of the source/drain regions of the backside transistors 42. Also, and in this embodiment, the backside bitline 48 is vertically spaced apart from both the backside transistors 42 and the backside capacitors 40.

Each backside transistor 42 is a FET including a gate dielectric material, as mentioned above, and a gate electrode, as also mentioned above. The backside bitline 48 is composed of one of the electrically conductive metal-containing materials mentioned above for the frontside bitline 20. The backside bitline 48 can include a thin metal adhesion layer (such as TiN, TaN). The backside bitline 48 is present in the DRAM device region 102 and the peripheral transistor device region 100 including both sub-region A1 and sub-region A2. The backside bitline-to-transistor contact structures 46 are composed of materials as mentioned above for the frontside bitline-to-transistor contact structures 18.

The first backside interlayer dielectric material layer 44 and the second backside interlayer dielectric material layer 50 are composed of one of the dielectric material mentioned above for the frontside interlayer dielectric material structure 26. The dielectric material that provides the first backside interlayer dielectric material layer 44 can be compositionally the same as, or compositionally different from, the dielectric material that provides the second backside interlayer dielectric material layer 50. In the present application, the first backside interlayer dielectric material layer 44 embeds the backside transistors 42, the backside bitline-to-transistor contact structures 46 and the backside bitline 48 (not readily seen in the cross sectional view).

The plurality of backside transistors 42 can be formed utilizing FET fabrication techniques that are well known to those skilled in the art. The first and second backside interlayer dielectric material layers 44, 50 can be formed by a deposition process (e.g., CVD, PECVD, spin-on coating). The backside bitline 48 and the backside bitline-to-transistor contact structures 46 can be formed utilizing a metallization process.

Figure 6:
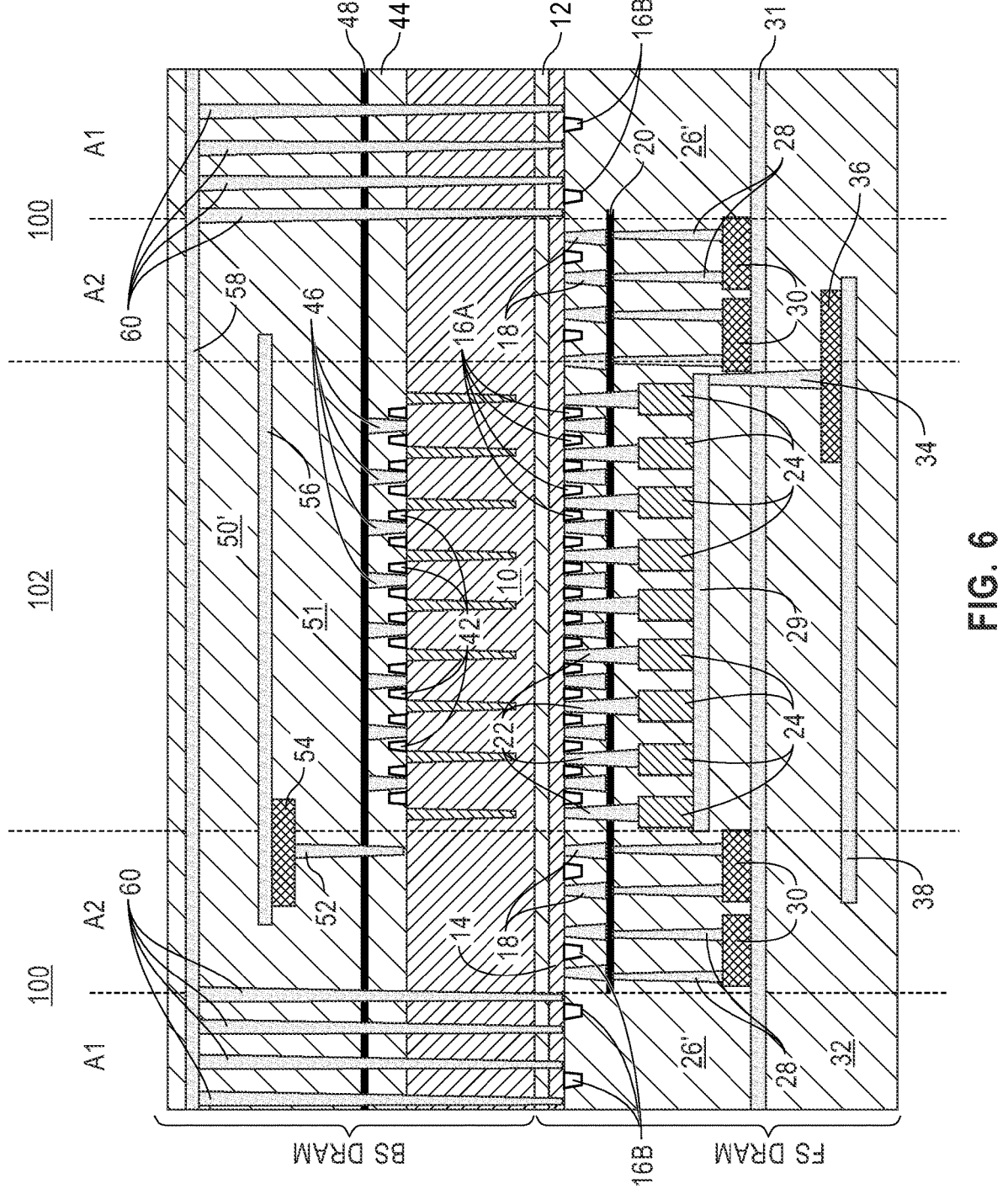
FIG. 6 is a cross sectional view of the exemplary structure shown in FIG. 5 after forming a backside BEOL structure, the backside BEOL structure including backside metal lines, backside metal vias, and a backside line-to-via contact structure.

Referring now to FIG. 6, there is illustrated the exemplary structure shown in FIG. 5 after forming a backside BEOL structure, the backside BEOL structure including backside metal lines 56, 58, backside metal vias 52, 60, and a backside line-to-via contact structure 54. The backside metal lines 56, 58, backside metal vias 52, 60, and backside line-to-via contact structure 54 include materials as mentioned above for the metal lines, metal vias, and line-to-via contact structures that were formed on the frontside of the structure. It is noted that the backside BEOL structure includes the formation of one of more additional backside interlayer dielectric material layers on the second backside interlayer dielectric material layer 50; collectively the additional backside interlayer dielectric material layers and the second backside interlayer dielectric material layer 50 provide a backside interlayer dielectric material structure 50' having the various backside BEOL metal structures mentioned above embedded therein. The additional backside interlayer dielectric material layers can be formed by deposition, and the various backside BEOL metal structures mentioned above can be formed by a metallization process.

As is illustrated in FIG. 6, the backside metal vias 60 are formed in the peripheral transistor device region 100 and provide an electrically connection from backside metal line 58 to the peripheral transistors 16B that are present on the frontside of the structure; the backside metal vias 60 pass through the backside bitline 48 and the semiconductor substrate. As is further illustrated in FIG. 6, the backside metal line 56 is electrically connected to the backside semiconductor device layer 10 by backside line-to-via contact structure 54 and backside metal via 52.

Figure 7:
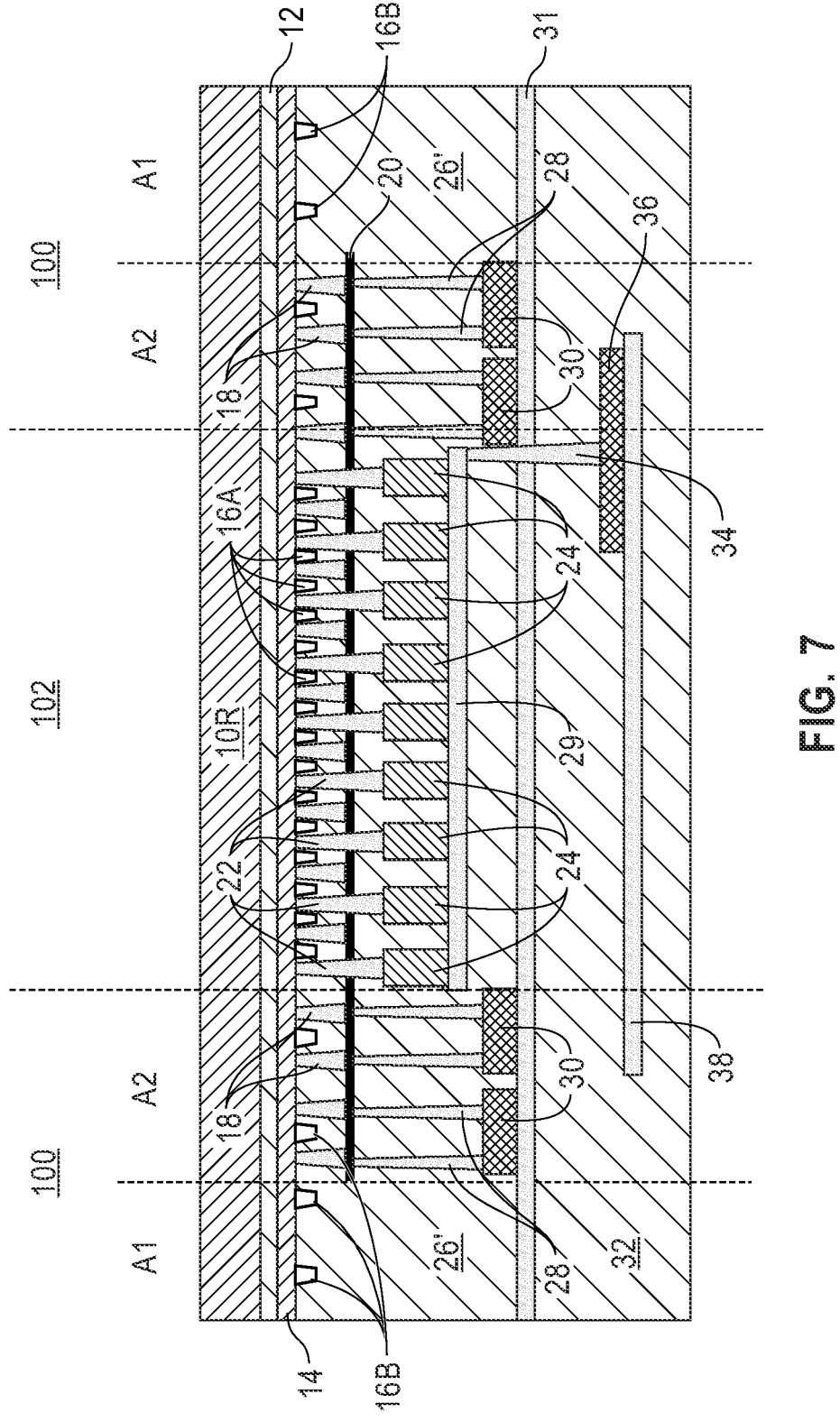
FIG. 7 is a cross sectional view of the exemplary structure shown in FIG. 3 after recessing a backside semiconductor device layer of the semiconductor substrate.

Referring now to FIG. 7, there is illustrated the exemplary structure shown in FIG. 3 after recessing a backside semiconductor device layer 10 of the semiconductor substrate. The recessing removes a portion of the backside semiconductor device layer 10 and provides a reduced thickness backside semiconductor device layer 10R. The recessing of the backside semiconductor device layer can include a grinding (or any other like planarization) process.

Figure 8:
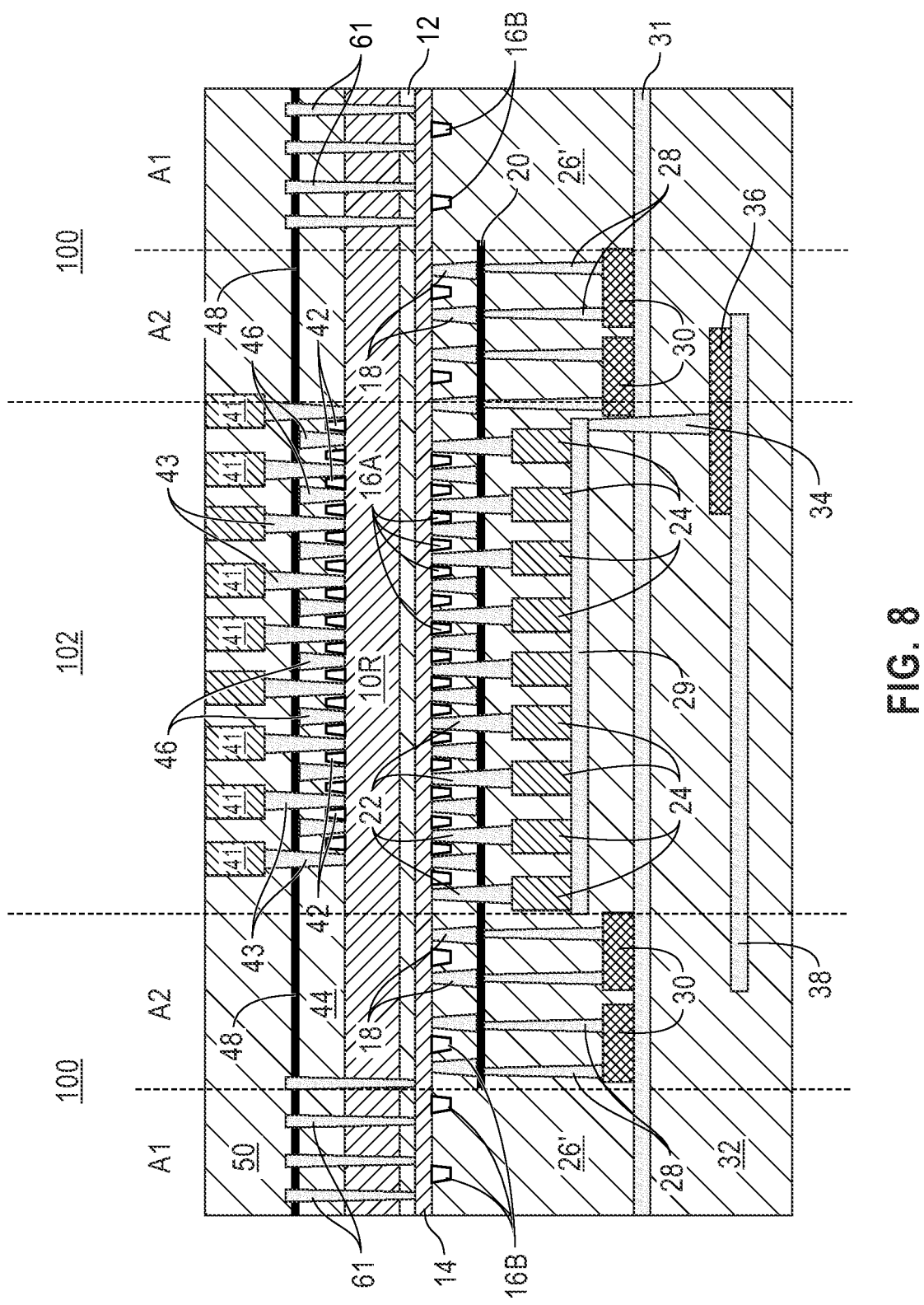
FIG. 8 is a cross sectional view of the exemplary structure shown in FIG. 7 after forming a plurality of backside transistors, a backside bitline and a plurality of backside capacitors, wherein each backside capacitor is a stacked capacitor that is embedded in a backside dielectric material layer.

Referring now to FIG. 8, there is illustrated the exemplary structure shown in FIG. 7 after forming a plurality of backside transistors 42, a backside bitline 48 and a plurality of backside capacitors 41, wherein each backside capacitor 41 is a stacked capacitor that is embedded in a backside dielectric material layer (e.g., second backside interlayer dielectric material layer 50). Also, formed at this point of the present application are a first backside interlayer dielectric material layer 44, second backside interlayer dielectric material layer 50, backside bitline-to-transistor contact structures 46, capacitor-to-transistor contact structures 43, and bitline-to-peripheral transistor contact structures 61. As is illustrated, the backside transistors 42 are formed on a surface of the reduced thickness backside semiconductor layer 10R, and the backside bitline 48 is formed between the backside transistors 42 and the backside capacitors 41. As is further shown, the bitline-to-peripheral transistor contact structures 61 pass through the reduced thickness backside semiconductor layer 10. These backside elements can be formed utilizing processing steps including FET formation, stacked capacitor formation and metallization that are well known to those skilled in the art.

The backside transistors 42, the backside bitline 48, first and second backside interlayer dielectric material layers 44, 50, and backside bitline-to-transistor contact structures 46 have been previously described above in connection with the exemplary structure shown in FIG. 5, The backside capacitors 41 are stacked capacitors as described above. The capacitor-to-transistor contact structures 43 and the bitline-to-peripheral transistor contact structures 61 include at least a contact conductor material as described above, and are formed by metallization.

The first backside interconnect dielectric material layer 44 embeds an upper portion of the bitline-to-peripheral transistor contact structures 61, a lower portion of the backside bitline-to-transistor contact structures 43, and the backside bitline 48 (not evident from the cross sectional view). The second backside interlayer dielectric material layer 50 embeds the backside capacitors 41 and an upper portion of the backside bitline-to-transistor contact structures 43.

Figure 9:
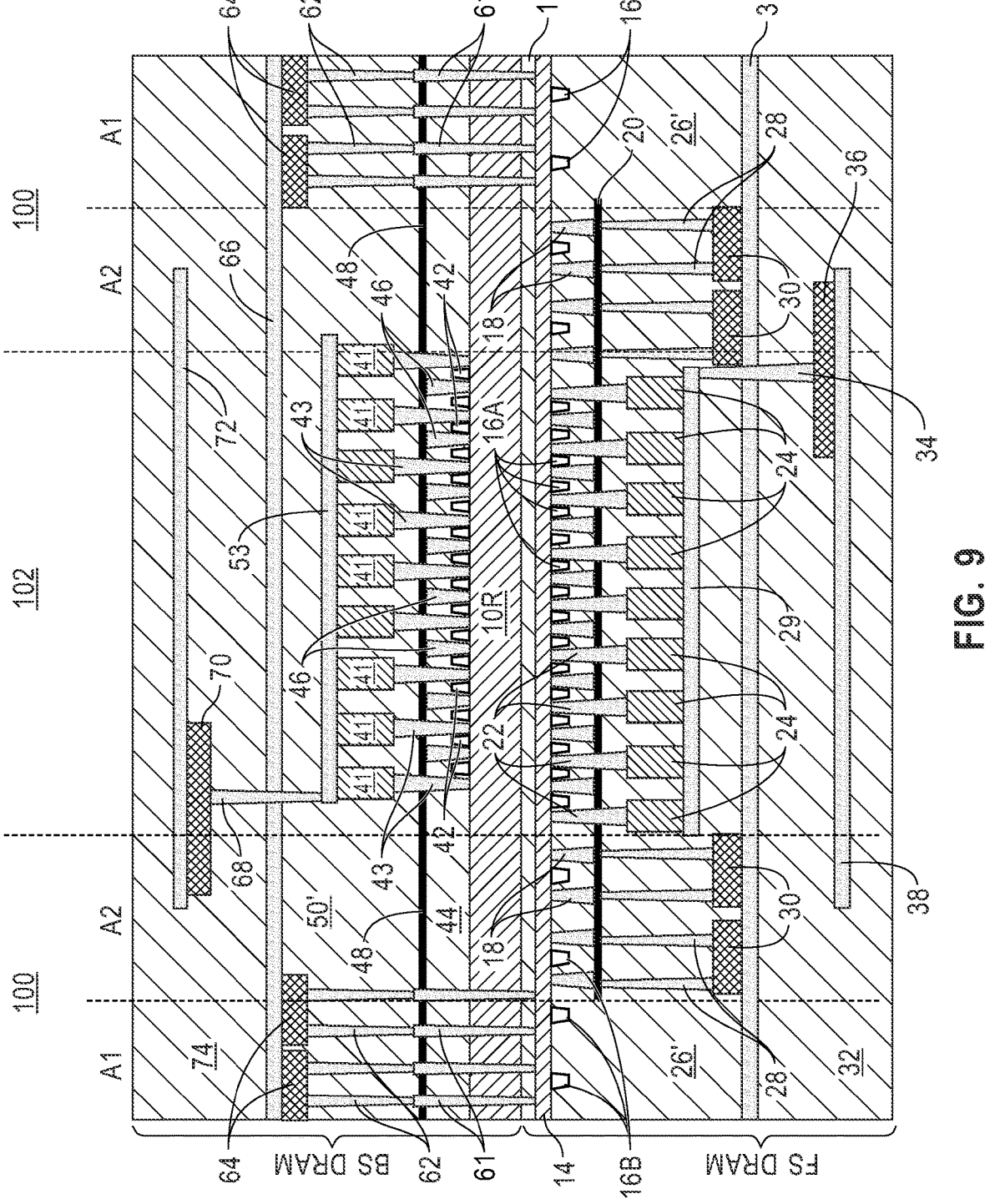
FIG. 9 is a cross sectional view of the exemplary structure shown in FIG. 8 after forming a backside BEOL structure, the backside BEOL structure including backside metal lines, backside metal vias, and backside line-to-via contact structures.

Referring now to FIG. 9, there is illustrated the exemplary structure shown in FIG. 8 after forming a backside BEOL structure, the backside BEOL structure including backside metal lines 53, 66, 72, backside metal vias 62, 68, and backside line-to-via contact structures 64, 70. It is noted that the backside BEOL structure includes the formation of one of more additional backside interlayer dielectric material layers on the second backside interlayer dielectric material layer 50. Collectively, at least one of the additional backside interlayer dielectric material layers and the second backside interlayer dielectric material layer 50 provide a backside interlayer dielectric material structure 50'. Another of the additional backside interlayer dielectric material layers provided third backside interlayer dielectric material layer 74. The additional backside interlayer dielectric material layers can be formed by deposition, and the various backside BEOL metal structures mentioned above can be formed by a metallization process, and include materials as mentioned above.

In the present application, backside metal line 53 is formed directly on top of each of the backside capacitors 41 and backside metal line 53 is electrically connected to backside metal line 72 by backside metal via 68 and backside line-to-via contact structure 54. Backside metal vias 68 pass through the backside metal line 66, and backside metal line 66 is electrically connected to the peripheral transistors 16B by the backside line-to-via contact structure 65, backside metal vias 62 and backside bitline-to-peripheral transistor contact structures 61.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a semiconductor substrate having a frontside and a backside;
   a frontside dynamic random access memory (DRAM) comprising a plurality of frontside transistors and a plurality of frontside capacitors located on the frontside of the semiconductor substrate;
   a backside DRAM comprising a plurality of backside transistors and a plurality of backside capacitors located on the backside of the semiconductor substrate; and
   a plurality of peripheral transistors located on the frontside of the semiconductor substrate and at a same device level as the plurality of frontside transistors, wherein the plurality of peripheral transistors are electrically connected to both the frontside DRAM and the backside DRAM.

2. The semiconductor structure of claim 1, wherein the plurality of peripheral transistors are connected to the backside DRAM through the semiconductor substrate.

3. The semiconductor structure of claim 1, wherein each frontside capacitor of the plurality of frontside capacitors is a frontside stacked capacitor.

4. The semiconductor structure of claim 3, wherein each backside capacitor of the plurality of backside capacitors is a backside trench capacitor.

5. The semiconductor structure of claim 4, wherein the backside trench capacitor is located in a backside semiconductor device layer of the semiconductor substrate.

6. The semiconductor structure of claim 5, wherein a portion of the backside semiconductor device layer is doped and serves as a first electrode of the backside trench capacitor.

7. The semiconductor structure of claim 3, wherein each backside capacitor of the plurality of backside capacitors is a backside stacked capacitor.

8. The semiconductor structure of claim 7, wherein the backside stacked capacitor is embedded in a backside interlayer dielectric material layer.

9. The semiconductor structure of claim 1, further comprising:

a frontside bitline located between the plurality of frontside transistors and the plurality of frontside capacitors.

10. The semiconductor structure of claim 9, wherein the frontside bitline is electrically connected to one source/drain region of each of the frontside transistors of the plurality of frontside transistors by a frontside bitline-to-transistor contact structure, and each of the frontside capacitors of the plurality of frontside capacitors is electrically connected to another source/drain region of each of the frontside transistors of the plurality of frontside transistors by a frontside capacitor-to-transistor contact structure, the frontside capacitor-to-transistor contact structure passes through a portion of the frontside bitline.

11. The semiconductor structure of claim 1, further comprising:

a backside bitline located between the plurality of backside transistors and the plurality of backside capacitors.

12. The semiconductor structure of claim 11, wherein each of the backside capacitors of the plurality of backside capacitors is a stacked capacitor, and wherein the backside bitline is electrically connected to one source/drain region of each of the backside transistors of the plurality of frontside transistors by a backside bitline-to-transistor contact structure, and each of the stacked capacitors is electrically connected to another source/drain region of each of the backside transistors of the plurality of backside transistors by a backside capacitor-to-transistor contact structure, the backside capacitor-to-transistor contact structure passes through a portion of the backside bitline.

13. The semiconductor structure of claim 1, further comprising:

a backside bitline vertically spaced apart from both the plurality of backside transistors and the plurality of backside capacitors.

14. The semiconductor structure of claim 13, wherein each of the backside capacitors of the plurality of backside capacitors is a trench capacitor, and wherein the backside bitline is electrically connected to one source/drain region of each of the backside transistors of the plurality of backside transistors by a backside bitline-to-transistor contact structure, and each of the trench capacitors is in direct physical contact with another source/drain region of each of the backside transistors of the plurality of backside transistors.

15. The semiconductor structure of claim 1, wherein the plurality of frontside transistors and the plurality of peripheral transistors are located on a frontside semiconductor device layer of the semiconductor substrate, and the plurality of backside transistors are located on a backside semiconductor device layer of the semiconductor substrate.

16. The semiconductor structure of claim 15, wherein and the frontside semiconductor device layer and the backside semiconductor device layer are spaced apart by a dielectric material layer.

17. The semiconductor structure of claim 1, wherein a first set of the plurality of peripheral transistors provides logic devices for the backside DRAM, and a second set of the plurality of peripheral transistors provides logic devices for the frontside DRAM.

18. The semiconductor structure of claim 17, wherein the first set of the plurality of peripheral transistors are electrically connected to a backside metal line by at least a backside metal via.

19. The semiconductor structure of claim 17, wherein the second set of the plurality of peripheral transistors are electrically connected to a frontside metal line by a frontside metal via and a frontside bitline-to-transistor contact structure.

20. The semiconductor structure of claim 1, wherein the frontside DRAM and the backside DRAM are vertically stacked one atop the other and a spaced apart from each other by at least a dielectric material layer of the semiconductor substrate.

* * * * *